(12) United States Patent
Yoshida et al.

(10) Patent No.: US 7,063,600 B2
(45) Date of Patent: Jun. 20, 2006

(54) POLISHING APPARATUS

(75) Inventors: Masao Yoshida, Tokyo (JP); Masahiko Sekimoto, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 11/177,278

(22) Filed: Jul. 11, 2005

(65) Prior Publication Data

US 2006/0003672 A1    Jan. 5, 2006

Related U.S. Application Data

(62) Division of application No. 09/931,412, filed on Aug. 17, 2001, now Pat. No. 6,929,529, which is a division of application No. 09/423,445, filed as application No. PCT/JP99/01131 on Mar. 9, 1999, now Pat. No. 6,293,855.

(30) Foreign Application Priority Data

Mar. 9, 1998   (JP)   ................................ 10-74870
Sep. 8, 1998   (JP)   ................................ 10-253418

(51) Int. Cl.
*B24B 1/00*  (2006.01)
(52) U.S. Cl. .................. 451/67; 451/287; 451/288; 451/289; 451/66
(58) Field of Classification Search ............ 451/66–67, 451/5, 8–10, 41, 187; 454/187; 414/935, 414/331.01
See application file for complete search history.

(56) References Cited

U.S. PATENT DOCUMENTS

| | | | |
|---|---|---|---|
| 4,197,679 A | 4/1980 | Yamada et al. | |
| 4,951,601 A * | 8/1990 | Maydan et al. | ............. 118/719 |
| 5,074,079 A | 12/1991 | Park | |
| 5,382,127 A | 1/1995 | Garric et al. | |
| 5,468,302 A | 11/1995 | Thietje | |
| 5,498,199 A | 3/1996 | Karlsrud et al. | |
| 5,498,294 A | 3/1996 | Matsushita et al. | |
| 5,518,542 A | 5/1996 | Matsukawa et al. | |
| 5,655,954 A | 8/1997 | Oishi et al. | |
| 5,679,059 A | 10/1997 | Nishi et al. | |
| 5,725,414 A | 3/1998 | Moinpour et al. | |
| 5,830,045 A | 11/1998 | Togawa et al. | |
| 5,860,640 A | 1/1999 | Marohl et al. | |
| 5,885,138 A | 3/1999 | Okumura et al. | |
| 5,893,794 A | 4/1999 | Togawa et al. | |
| 5,904,611 A | 5/1999 | Takahashi et al. | |
| 6,036,582 A | 3/2000 | Aizawa et al. | |
| 6,050,884 A | 4/2000 | Togawa et al. | |
| 6,149,500 A | 11/2000 | Takahashi et al. | |
| 6,168,672 B1 * | 1/2001 | Nguyen | ....................... 134/18 |

(Continued)

FOREIGN PATENT DOCUMENTS

JP          60-80241          8/1985

(Continued)

*Primary Examiner*—George Nguyen
(74) *Attorney, Agent, or Firm*—Wenderoth, Lind & Ponack, L.L.P.

(57) ABSTRACT

The present invention relates to a polishing apparatus for polishing a workpiece such as a semiconductor wafer. The polishing apparatus has a processing section including a polishing section (1) for polishing a semiconductor wafer (6) and a cleaning section (10) for cleaning a polished semiconductor wafer, a receiving section (40) for supplying a semiconductor wafer (6) to be polished to the processing section and receiving a polished semiconductor wafer (6), and a cleaning chamber (20) disposed between the processing section and the receiving section and defined by partitions (102, 103) with shutters (22, 24) which separate the processing section and the receiving section from each other.

5 Claims, 10 Drawing Sheets

U.S. PATENT DOCUMENTS 6,439,962 B1  8/2002  Ato

FOREIGN PATENT DOCUMENTS

| | | |
|---|---|---|
| JP | 3-64477 | 3/1991 |
| JP | 6-252110 | 9/1994 |
| JP | 7-56879 | 6/1995 |
| JP | 7-230974 | 8/1995 |
| JP | 7-508685 | 9/1995 |
| JP | 8-66865 | 3/1996 |
| JP | 8-153694 | 6/1996 |
| JP | 8-153697 | 6/1996 |
| JP | 8-243916 | 9/1996 |

\* cited by examiner

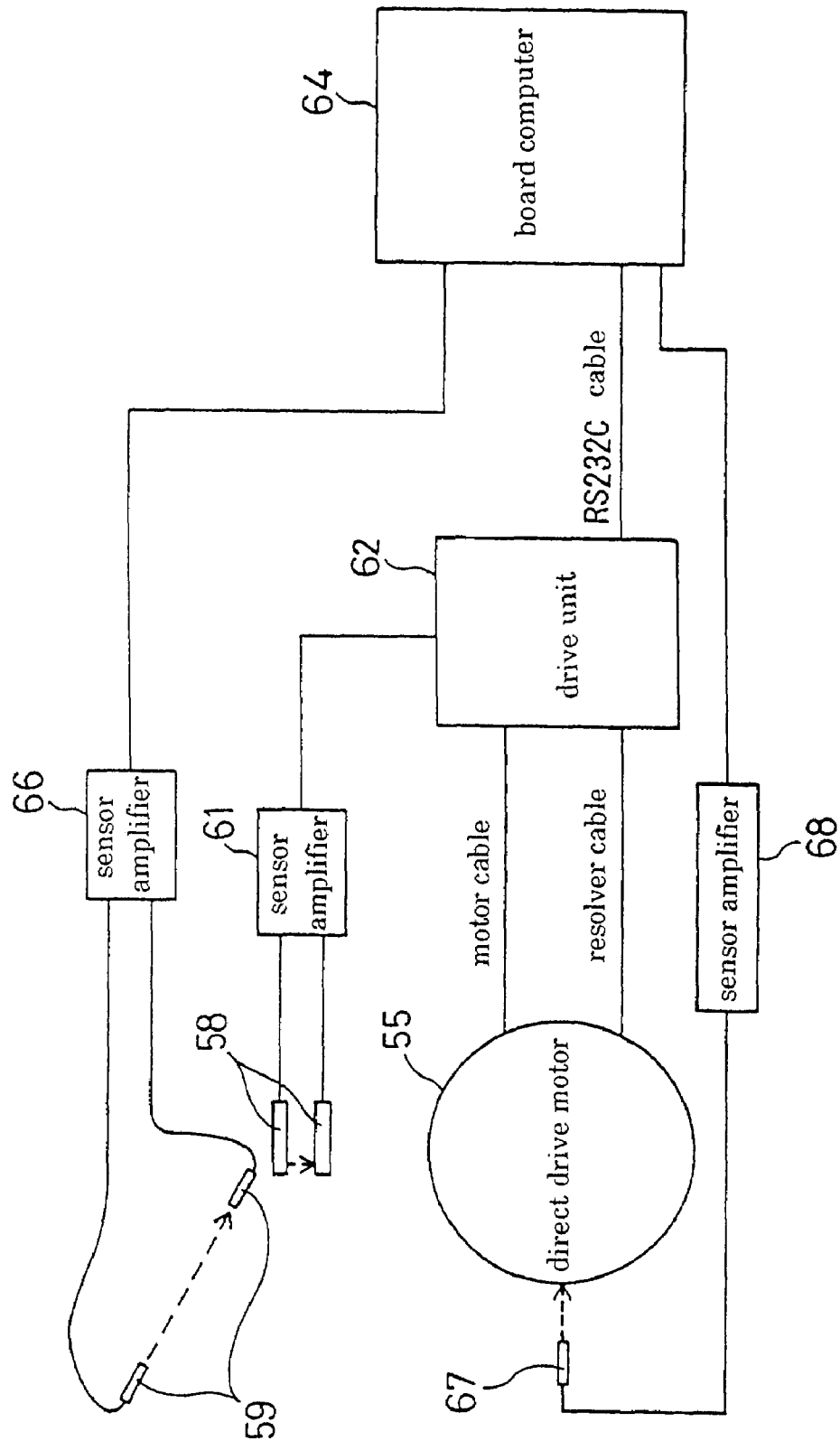

POLISHING APPARATUS

This application is a divisional of U.S. Ser. No. 09/931,412, filed Aug. 17, 2001 now U.S. Pat. No. 6,929,529, which is a divisional of U.S. Ser. No. 09/423,445, filed Nov. 9, 1999, which is a National Stage application of PCT/JP99/01131, filed Mar. 9, 1999, now U.S. Pat. No. 6,293,855.

TECHNICAL FIELD

The present invention relates to a polishing apparatus, and more particularly to a polishing apparatus for polishing a workpiece such as a semiconductor wafer to a flat mirror finish.

BACKGROUND ART

Recent rapid progress in semiconductor device integration demands smaller and smaller wiring patterns or interconnections and also narrower spaces between interconnections which connect active areas. If a photolithographic process is used to form circuits, then since the depth of focus of the optical system is relatively small, the focused surface of a stepper requires a high level of flatness. One of the available processes for planarizing surfaces of semiconductor wafers is a chemical mechanical polishing (CMP) conducted by a polishing apparatus in which while supplying an abrasive liquid containing abrasive particles to a polishing cloth mounted on a rotating turntable, the semiconductor wafer held by a carrier is pressed against the polishing cloth and polished thereby.

There has been proposed a polishing apparatus having a processing section such as a polishing section accommodated in a housing so that the polishing apparatus can be installed in a clean room. In this kind of apparatus, a semiconductor wafer is taken out from a wafer cassette mounting section in which a wafer cassette is mounted, transported to a polishing section and polished therein, and the polished semiconductor wafer is cleaned by a cleaning section, and then returned to the wafer cassette in the wafer cassette mounting section.

In the above conventional polishing apparatus, the wafer cassette mounting section for mounting wafer cassettes and the processing section such as a polishing section and a cleaning section are not separated from each other, but are kept in the same environment. Therefore, the cleanliness of the processing section is enhanced to prevent semiconductor wafers in the wafer cassettes, before and after being processed, from being contaminated by the processing section. As a result, the cleanliness of the processing section is required to be higher than necessary, thus increasing the operating cost of the polishing apparatus, and the cleanliness of the semiconductor wafers in the wafer cassettes depends on the cleanliness of the processing section.

In the above conventional polishing apparatus, furthermore, after a semiconductor wafer is processed, e.g., polished, cleaned, a reference position indicated by an orientation flat or a notch of the semiconductor wafer is positioned in alignment with a predetermined direction in a separate process by a dedicated machine. Therefore, it is necessary to incorporate the separate process for positioning semiconductor wafers in the semiconductor fabrication process, and the dedicated machine for positioning semiconductor wafers is required.

DISCLOSURE OF INVENTION

The present invention has been made in view of the above problems. It is a first object of the present invention to provide a polishing apparatus having an independent chamber defined by a partition with a shutter and disposed between a processing section including a polishing section, a cleaning section and the like and a receiving section including wafer cassette units, the independent chamber having an increased level of cleanliness for preventing contamination from being introduced from the processing section into the receiving section.

A second object of the present invention is to provide a polishing apparatus capable of positioning a semiconductor wafer by aligning a reference position (such as an orientation flat or a notch) of the semiconductor wafer with a predetermined direction during a transportation process in a polishing apparatus.

To achieve the first object described above, according to a first aspect of the present invention, there is provided a polishing apparatus for polishing a workpiece such as a semiconductor wafer, comprising: a processing section for polishing a workpiece; a receiving section for supplying a workpiece to be polished to the processing section and/or receiving a polished workpiece; and a clean chamber disposed between the processing section and the receiving section and including a partition with a shutter which separates the processing section and the receiving section from each other. The receiving section serves to supply a workpiece to be polished to the processing section, or receive a polished workpiece, or supply a workpiece to be polished to the processing section and receive a polished workpiece.

In the first aspect of the present invention, contaminants in the processing section are prevented from reaching the receiving section such as a wafer cassette unit, and hence cleanliness of the processing section is not required to be enhanced to an unnecessarily high level, and the receiving section may be kept clean.

To achieve the second object described above, according to a second aspect of the present invention, there is provided a polishing apparatus for polishing a semiconductor wafer, comprising: a processing section for polishing a semiconductor wafer; a receiving section for supplying a semiconductor wafer to be polished to the processing section and receiving a polished semiconductor wafer; and a positioning mechanism disposed between the processing section and the receiving section, for aligning a reference position of the semiconductor wafer with a predetermined direction while the semiconductor wafer is transported between the processing section and the receiving section.

In the second aspect of the present invention, a semiconductor wafer can be positioned by aligning a reference position (such as an orientation flat or a notch) of the semiconductor wafer with a predetermined direction during the transportation process between the processing section and the receiving section in the polishing apparatus.

BRIEF DESCRIPTION OF DRAWINGS

FIG. 11 is a block diagram showing a control circuit for the notch detecting sensor, a wafer detecting sensor, and a motor.

BEST MODE FOR CARRYING OUT THE INVENTION

A polishing apparatus according to an embodiment of the present invention will be described below with reference to the drawings.

Figure 1:
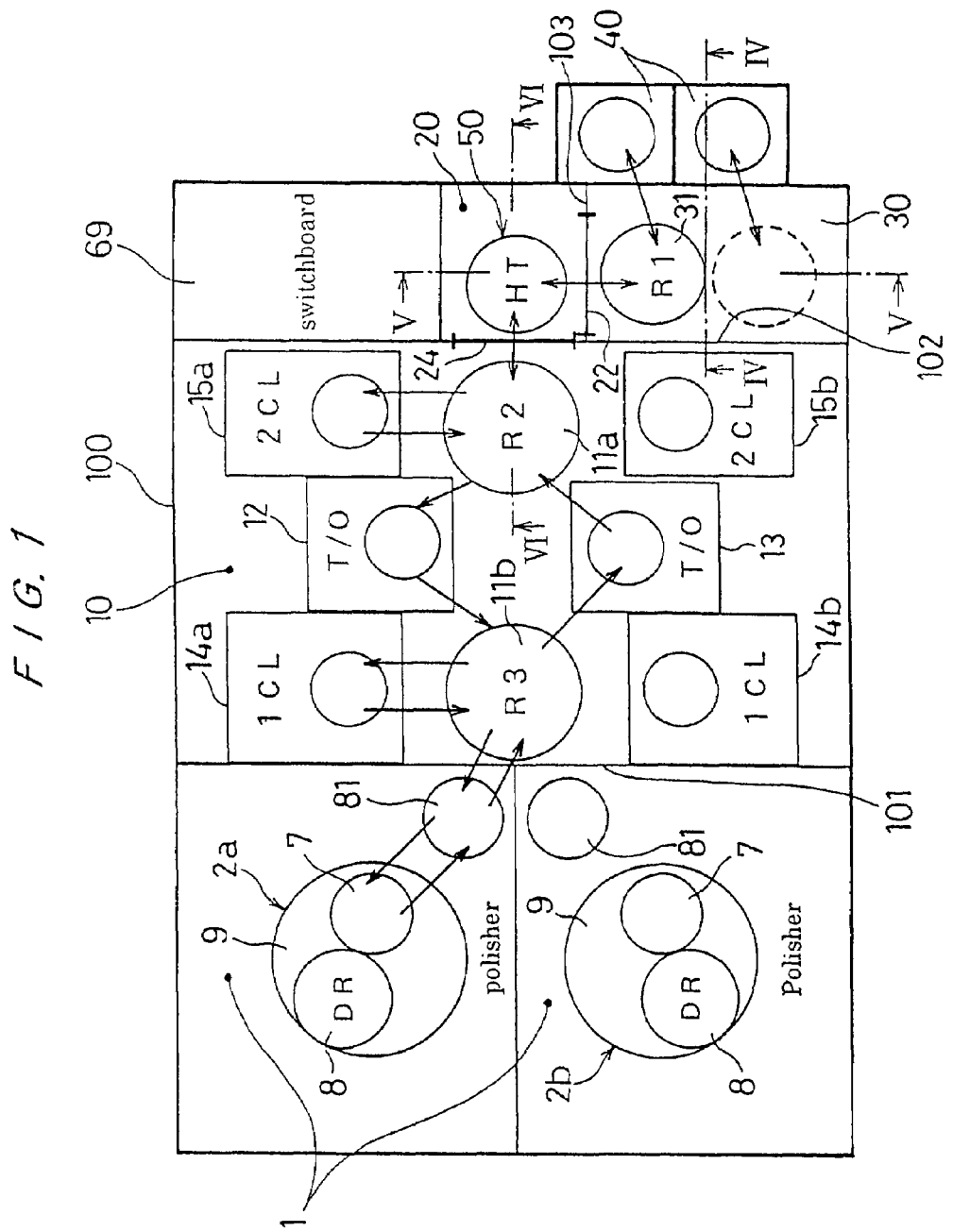
FIG. 1 is a schematic plan view of a polishing apparatus according to the present invention.
Figure 2:
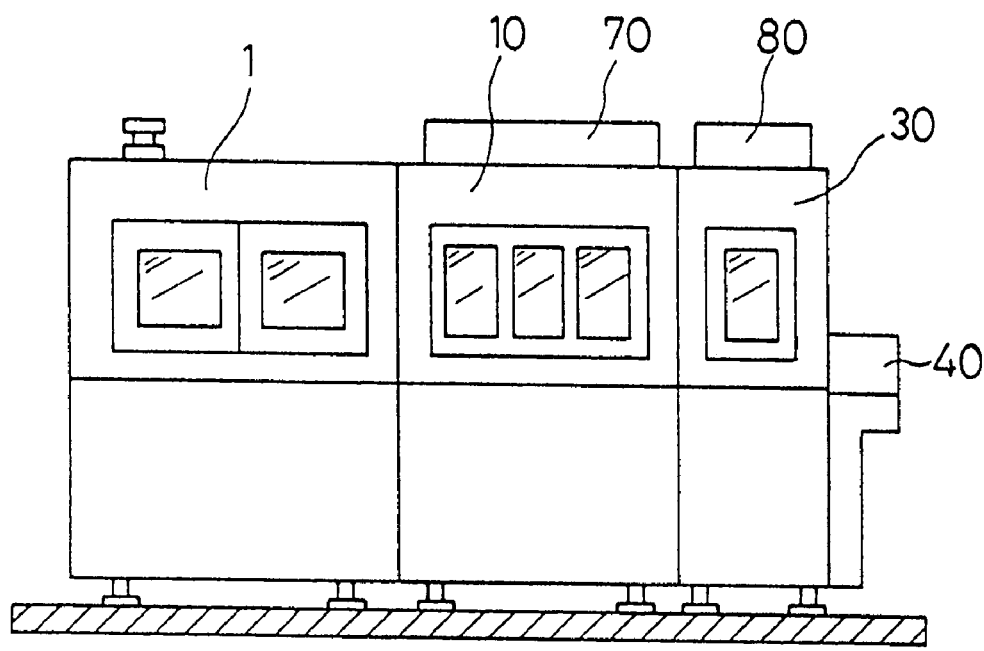
FIG. 2 is a side elevational view showing an appearance of the polishing apparatus according to the present invention.

FIG. 1 is a plan view of a polishing apparatus according to the present invention, and FIG. 2 is a side elevational view showing an appearance of the polishing apparatus. As shown in FIGS. 1 and 2, the polishing apparatus comprises a polishing section 1, a cleaning section 10, a clean chamber 20, a load and unload section 30, and wafer cassette units 40. All the components of the polishing apparatus, except for the wafer cassette units 40, are accommodated in a housing 100.

In the polishing section 1, a pair of polishing units 2a, 2b are disposed in laterally confronting relation to each other. In the cleaning section 10, two SCARA robots 11a, 11b are dispersed in a central region thereof, a pair of reversing machines 12, 13 are disposed one on each side of the SCARA robots 11a, 11b, and two primary cleaning machines 14a, 14b and two secondary cleaning machines 15a, 15b are disposed on respective opposite sides of the reversing machines 12, 13. A partition 101 is disposed between the polishing section 1 and the cleaning section 10, and has an opening defined therein for transferring semiconductor wafers therethrough between the polishing section 1 and the cleaning section 10.

A partition 102 is disposed to separate the cleaning section 10, and the clean chamber 20 and the load and unload section 30 from each other. A partition 103 is disposed to separate the clean chamber 20 and the load and unload section 30 from each other. A switchboard is placed in a chamber 69 surrounded by the cleaning section 10 and the clean chamber 20. The wafer cassette units 40, which are positioned adjacent to the load and unload section 30, are of a closed type capable of accommodating a wafer cassette in a space closed by a housing, and have a shutter openable for taking semiconductor wafers out. The wafer cassette units 40 serve as a receiving section for supplying semiconductor wafers to be polished to a processing section including the polishing section 1 and the cleaning section, and receiving polished semiconductor wafers.

As shown in FIG. 2, filter units 70, 80 are disposed above the cleaning section 10, and the load and unload section 30. The filter unit 70 serves to clean the air in the cleaning section 10, and the filter unit 80 serves to clean the air in the load and unload section 30.

Figure 6:
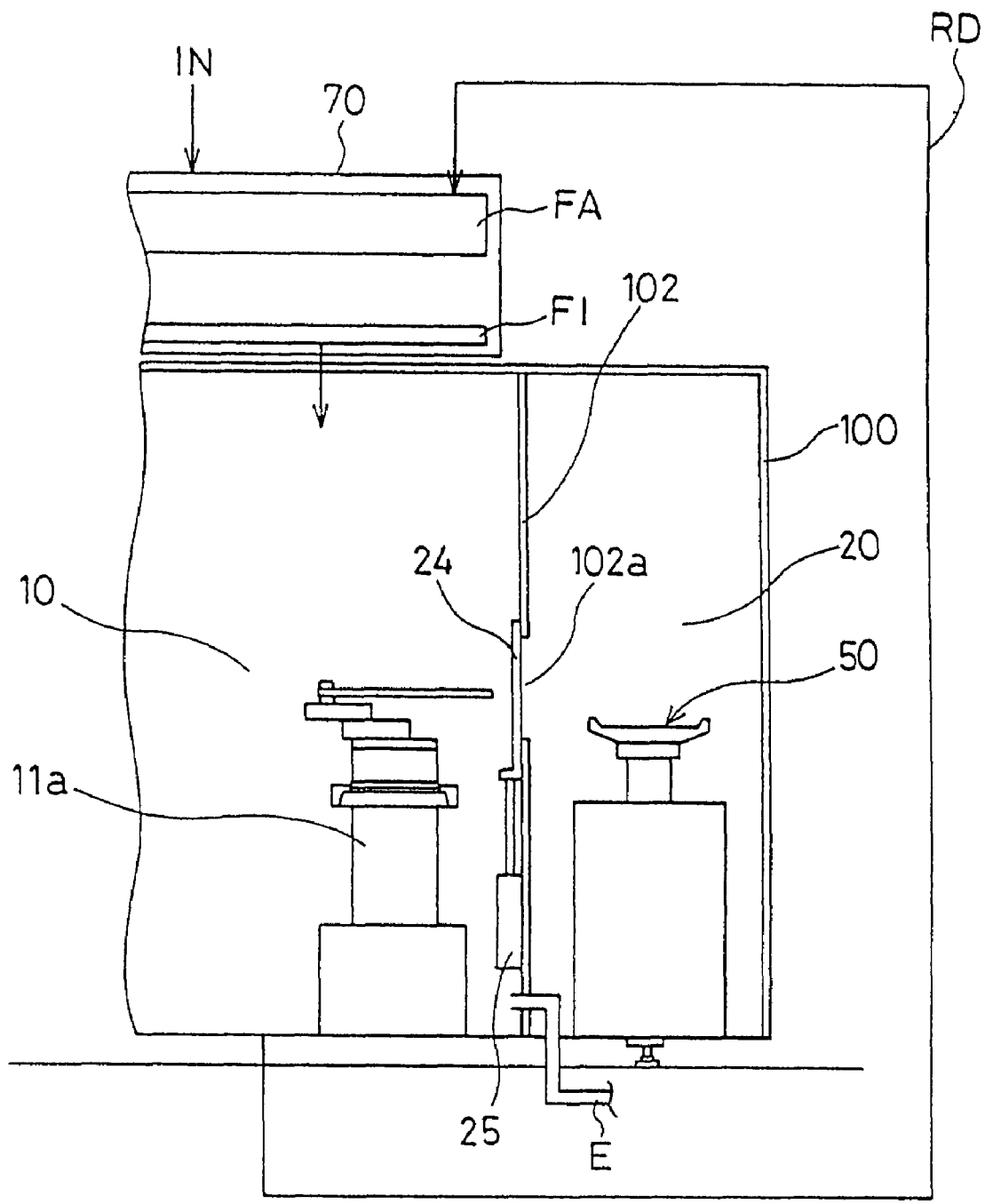
FIG. 6 is a cross-sectional view taken along line VI—VI of FIG. 1.

As shown in FIG. 6, the filter unit 70 comprises a filter FI and a fan FA positioned above the filter FI.

The cleaning section 10 has a floor with an air suction port defined therein and communicating with the filter unit 70 via a duct RD. The filter unit 70 produces a circulating flow in the cleaning section 10 as described below. The fan FA of the filter unit 70 is operated to draw air from the floor of the cleaning section 10 and allow the air to pass through the filter FI via the duct RD. The filter unit 70 is also supplied with fresh air (indicated by IN in FIG. 6) from outside of the polishing apparatus. The fresh air IN (which passes through the filter FI by the fan FA) and the air from the filter FI are delivered as a downflow to the cleaning section 10.

The cleaning section 10 has a discharge device E for forcibly discharging contaminated air in the cleaning section 10 out of the polishing apparatus.

Figure 5:
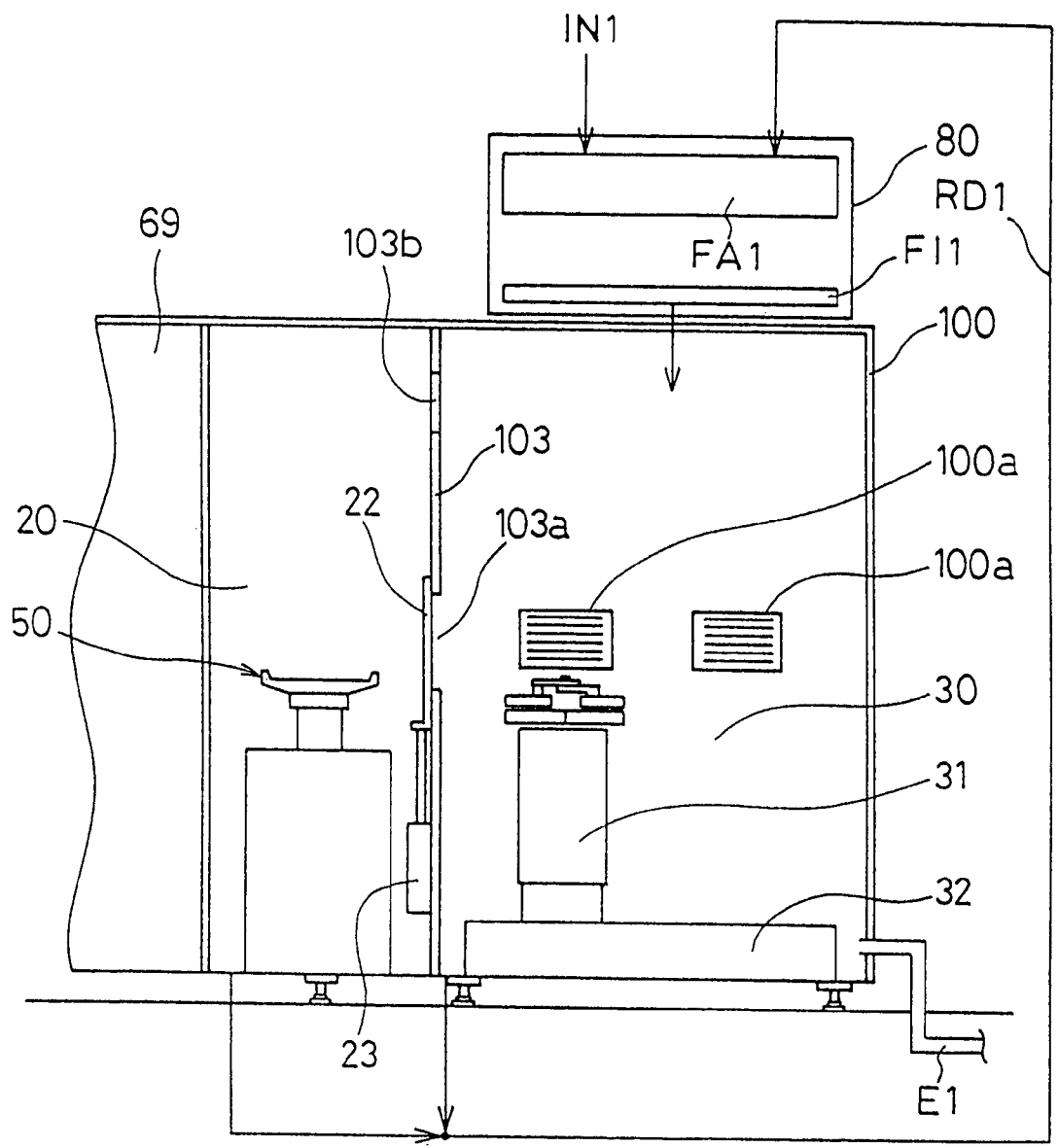
FIG. 5 is a cross-sectional view taken along line V—V of FIG. 1.

In FIG. 5, those parts which correspond to those shown in FIG. 6 are denoted by the same references characters as those in FIG. 6 with "1" added thereto. The filter unit 80 is of the same structure as the filter unit 70. The load and unload section 30 has a floor with an air suction port defined therein and communicating with the filter unit 80 in the same manner as described above. The load and unload section 30 also has a discharge device E1 for forcibly discharging contaminated air out of the polishing apparatus in the same manner as described above.

Since the cleaning section 10, and the clean chamber 20 and the load and unload section 30 are separated from each other by the partition 102, it is sufficient to keep the load and unload section 30 clean for the purpose of keeping the wafer cassette units 40 clean. Therefore, only the fan output power of the filter unit 80 needs to be increased to make the downflow intensive, and the fan output power of the filter unit 70 may be small. This is because the cleaning section 10 does not need to be cleaner than necessary. Thus, the fan output power of the filter unit 70 may be reduced, and a fan of low output power may be used to reduce the cost thereof, and the operating cost is also lowered.

As shown in FIG. 5, the partition 103 has a slit 103b. Air in the clean chamber 20 is drawn from an air suction port defined in a floor thereof via a duct RD1 by the filter unit 80 by which the air in the clean chamber 20 is cleaned. The filter unit 80 is adjusted to develop a pressure higher than the pressure of the filter unit 70 at all times to keep the clean chamber 20 clean. Specifically, the slit 103b and the duct RD1 produce a circulating flow in the clean chamber 20 to keep the clean chamber 20 clean. If the pressures in the load and unload section 30, the clean chamber 20, and the cleaning section 10 are represented by $P_{30}$, $P_{20}$, $P_{10}$, then these pressures are related to each other such that $P_{30} > P_{20} > P_{10}$. When a shutter 24 is open, no air flows from the cleaning section 10 into the clean chamber 20. The clean chamber 20 can thus keep a class 10 of cleanliness or lower. The load and unload section 30, the clean chamber 20, and the cleaning section 10 have a descending order of cleanliness because the load and unload section 30 positioned directly below the filter unit 80 is the cleanest.

In addition to the above, the pressure $P_{10}$ in the cleaning section 10 is adjusted so as to be lower than the pressure in a clean room in which the polishing apparatus is installed. The pressure $P_{30}$ in the load and unload section 30 is adjusted so as to be higher than the pressure in the clean room. Furthermore, the pressure $P_1$ in the polishing section 1 is lower than the pressure $P_{10}$ in the cleaning section 10. With the above pressure settings and shutter, it is possible to keep semiconductor wafers in the wafer cassettes in a high level of cleanliness, and the contaminated atmosphere in the polishing section 1 and the cleaning section 10 is prevented from affecting the semiconductor wafers in the wafer cassettes.

Figure 3:
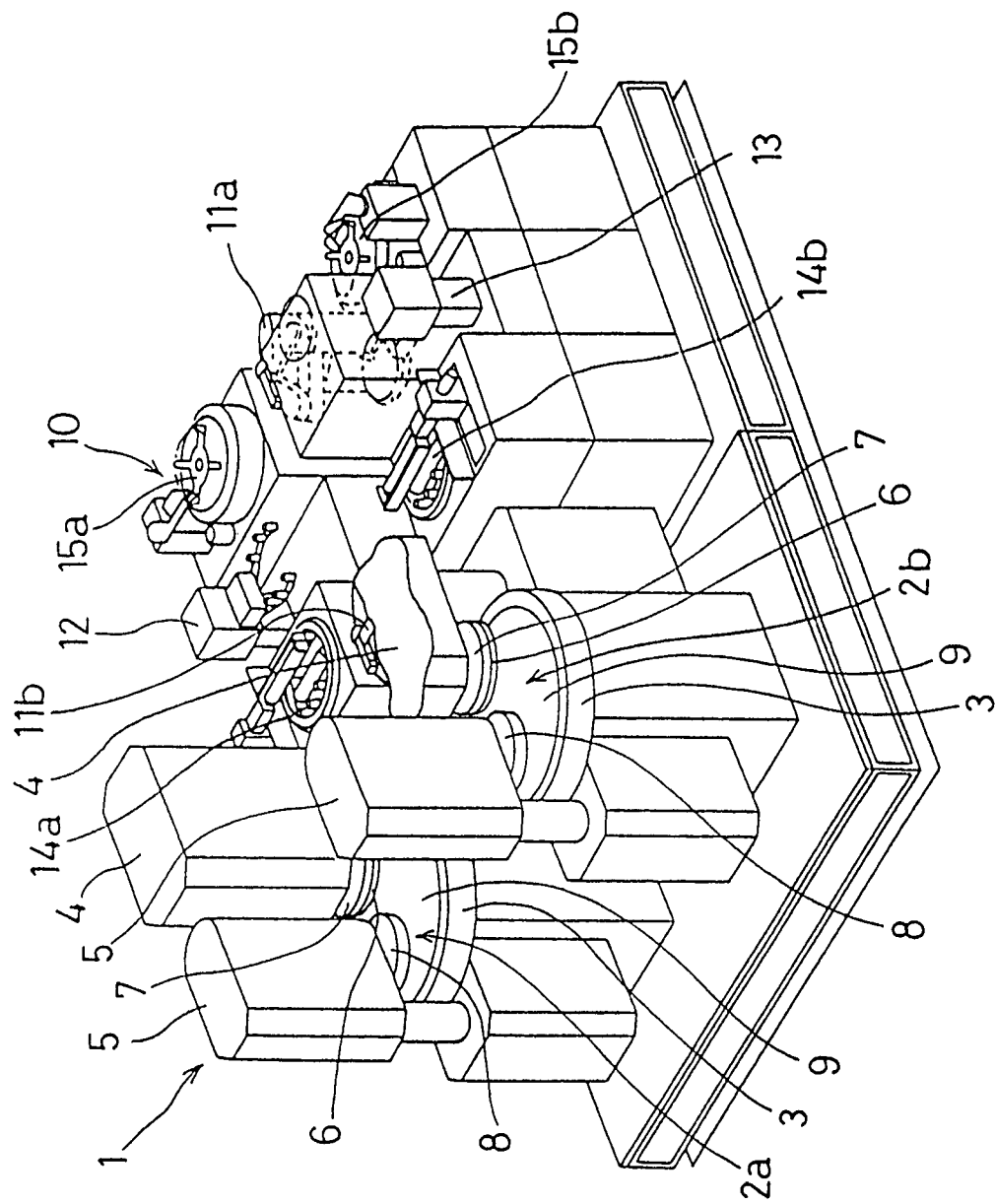
FIG. 3 is a perspective view showing details of a polishing section and a cleaning section shown in FIGS. 1 and 2.

FIG. 3 is a perspective view showing details of the polishing section 1 and the cleaning section 10. In FIG. 3, the housing 100 and the partition 101 between the polishing section 1 and the cleaning section 10 are omitted from illustration. As shown in FIG. 3, the two polishing units 2a, 2b are basically identical units positioned symmetrically. Each of the polishing units 2a, 2b comprises a turntable 3 with a polishing cloth 9 attach to an upper surface thereof, a top ring head 4 for holding a semiconductor wafer under vacuum and pressing the semiconductor wafer against the surface of the turntable, and a dressing head 5 for dressing the polishing cloth.

The top ring head 4 has a top ring 7 positioned above the turntable 3 for holding a semiconductor wafer 6 and pressing the semiconductor wafer 6 against the turntable 3. The turntable 3 is coupled to a motor (not shown) so as to be rotatable about its own axis. The top ring 7 is coupled to a motor and a lifting and lowering cylinder (not shown). Thus, the top ring 7 is vertically movable and rotatable about its own axis, and can press the semiconductor wafer 6 against the polishing cloth 9 under a desired pressure. The semiconductor wafer 6 is attracted to a lower end surface of the top ring 7 under vacuum or the like.

An abrasive liquid supply nozzle (not shown) is positioned above the turntable 3 for supplying an abrasive liquid to the polishing cloth 9 attached to the turntable 3. The dressing head 5 has a dressing member 8. The dressing member 8 is positioned in opposite relation to the top ring 7 across and over the polishing cloth 9, for dressing the polishing cloth 9. The polishing cloth 9 is supplied with a dressing liquid, e.g., pure water, for dressing the polishing cloth 9 from a dressing liquid supply nozzle (not shown) extending over the turntable 3. The dressing member 8 is coupled to a lifting and lowering cylinder and a motor, whereby the dressing member 8 can be vertically moved and rotated about its own axis.

In the polishing section 1 having the above structure, the semiconductor wafer 6 held by the top ring 7 is pressed against the polishing cloth 9, and the turntable 3 and the top ring 7 are rotated to cause the lower surface (the surface to be polished) of the semiconductor wafer 6 to be slidingly pressed against the polishing cloth 9. At this time, the abrasive liquid is supplied from the abrasive liquid supply nozzle onto the polishing cloth 9 to polish the surface of the semiconductor wafer 6 in a combination of a mechanical polishing action of the abrasive particles contained in the abrasive liquid and a chemical polishing action of alkali which is a liquid component of the abrasive liquid.

When the semiconductor wafer 6 is polished by a predetermined amount, the polishing process is finished. When the polishing process is finished, the properties of the polishing cloth 9 are changed, resulting in a poor polishing capability for a next polishing process. Therefore, the polishing cloth 9 is dressed by the dressing member 8.

As shown in FIG. 1, each of the polishing units 2a, 2b has a pusher 81 for transferring a semiconductor wafer to and from the top ring 7. The top ring 7 is swingable in a horizontal-plane, and the pusher 81 is vertically movable.

The cleaning machines may be of any desired structure. For example, the primary cleaning machines 14a, 14b comprise a cleaning machine of the type for scrubbing the front and backside surfaces of a semiconductor wafer with sponge rollers, and the secondary cleaning machines 15a, 15b comprise a cleaning machine of the type for supplying a cleaning liquid to a semiconductor wafer while holding the circumferential edge of the semiconductor wafer and rotating the semiconductor wafer. The latter cleaning machines 15a, 15b also function as drying machines for centrifugally dehydrating the semiconductor wafer. The primary cleaning machines 14a, 14b perform a primary cleaning of semiconductor wafers, and the secondary cleaning machines 15a, 15b perform a secondary cleaning of the semiconductor wafers which have been cleaned primarily.

Each of the SCARA robots 11a, 11b comprises a robot body and an articulated arm mounted on an upper portion of the robot body so as to be bendable in a horizontal plane. Each of the SCARA robots 11a, 11b has two grippers that are used as dry and wet fingers, respectively. The polishing apparatus has the two robots, and the first robot 11a covers an area extending from the reversing machines 12, 13 to the wafer cassette side, and the second robot 11b covers an area extending from the reversing machines 12, 13 to the polishing units.

Figure 4:
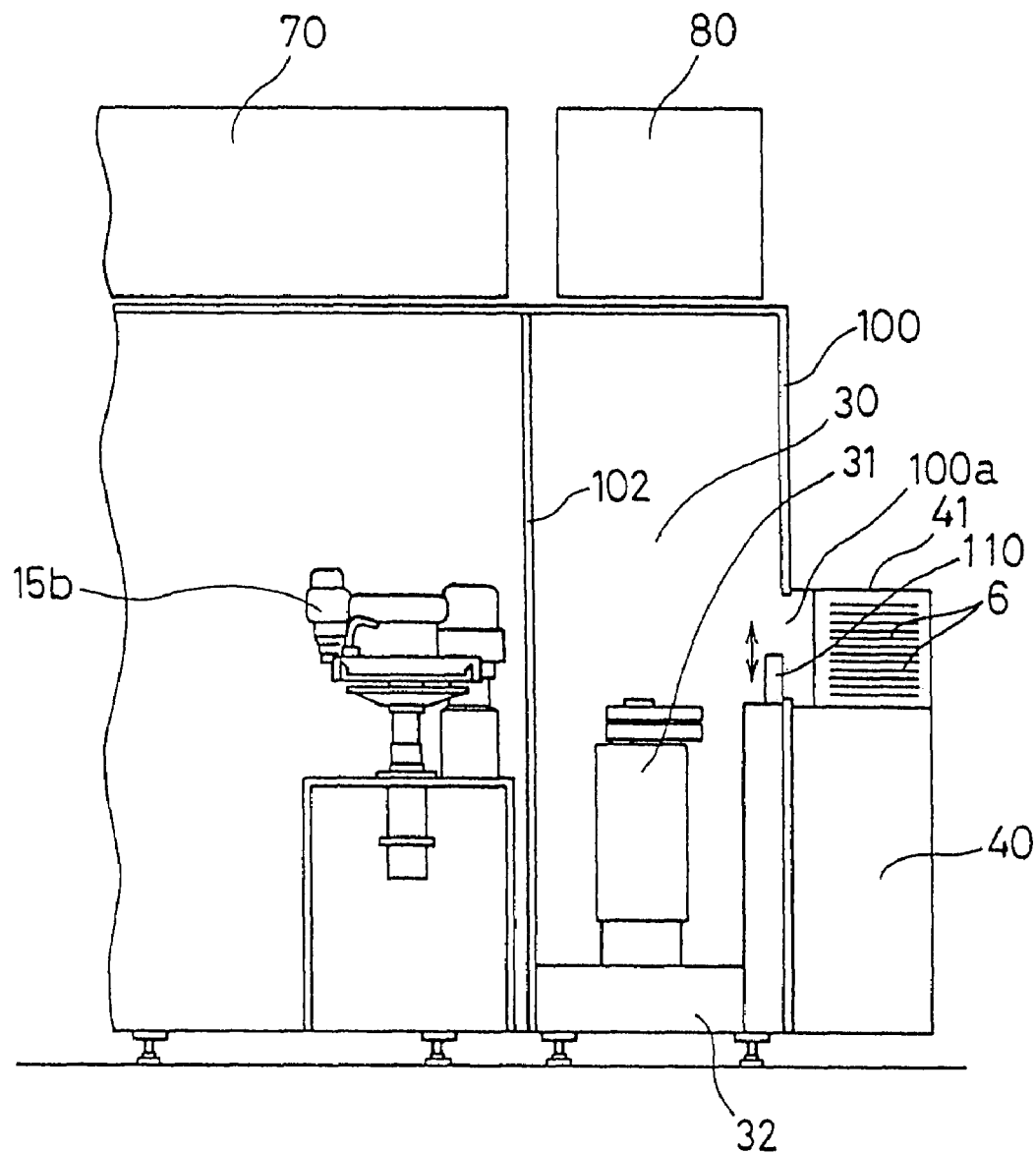
FIG. 4 is a cross-sectional view taken along line IV—IV of FIG. 1.

FIGS. 4 through 6 show the relationship between the cleaning section 10, the clean chamber 20, and the load and unload section 30. FIG. 4 is a cross-sectional view taken along line IV—IV of FIG. 1, FIG. 5 is a cross-sectional view taken along line V—V of FIG. 1, and FIG. 6 is a cross-sectional view taken along line VI—VI of FIG. 1. As shown in FIG. 4, a SCARA robot 31 is installed in the load and unload section 30. The SCARA robot 31 is movable between the solid-line position and the broken-line position in FIG. 1 by a linear motor 32. The housing 100 includes a wall positioned between the load and unload section 30 and the wafer cassette units 40, and the wall has an opening 100a (see FIG. 5). The SCARA robot 31 takes one semiconductor wafer 6 out at a time from a wafer cassette 41 in one of the wafer cassette units 40, and supplies the semiconductor wafer 6 to the clean chamber 20 adjacent thereto. The opening 100a can be closed by a vertically movable door 110. While a semiconductor wafer is being processed, the door 110 is opened to open the opening 100a. Before and after a semiconductor wafer is processed and while the polishing apparatus is not in operation, the door 110 is closed to isolate the load and unload section 30 and the wafer cassette units 40 from each other for maintenance and wafer cassette replacement. During the processing of a semiconductor wafer, therefore, the same atmosphere is maintained in the wafer cassette units 40 and the load and unload section 30.

As shown in FIG. 5, a handling table 50 is installed in the clean chamber 20. The partition 103 for separating the clean chamber 20 and the load and unload section 30 from each other has an opening 103a that can be opened and closed by a shutter 22. The shutter 22 can be opened and closed by an air cylinder 23. As shown in FIG. 6, the partition 102 for separating the clean chamber 20 and the cleaning section 10 from each other has an opening 102a that can be opened and closed by a shutter 24. The shutter 24 can be opened and closed by an air cylinder 25.

The wafer loading and unloading section is constructed as shown in FIGS. 4 through 6. For loading a semiconductor wafer into the processing section, the SCARA robot 31 takes a semiconductor wafer 6 out from one of the wafer cassette units 40, and the shutter 22 on the load and unload section 30 is opened. The SCARA robot 31 then sets the semiconductor wafer 6 on the handling table 50 in the clean chamber 20. Then, the shutter 22 is closed, and the shutter 24 in the processing section is opened. The SCARA robot 11a takes the semiconductor wafer 6 out from the handling table 50, and then the shutter 24 in the processing section is closed. For unloading a semiconductor wafer from the processing section, the above operation is reversed. When semiconductor wafers are loaded and unloaded in the above sequences, no contamination enters from the processing section into the load and unload section 30.

Figure 7:
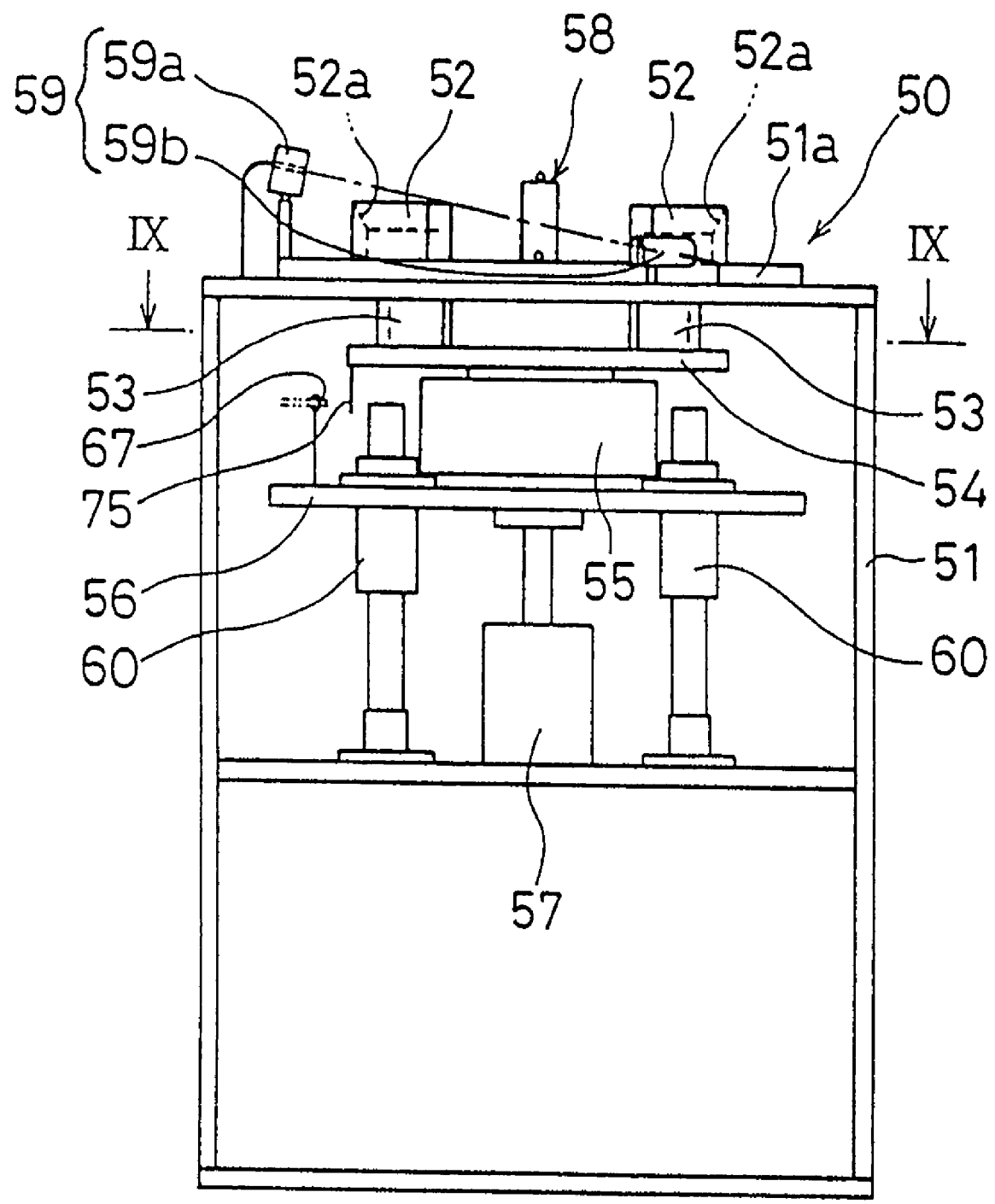
FIG. 7 is a front elevational view of a handling table.
Figure 8:
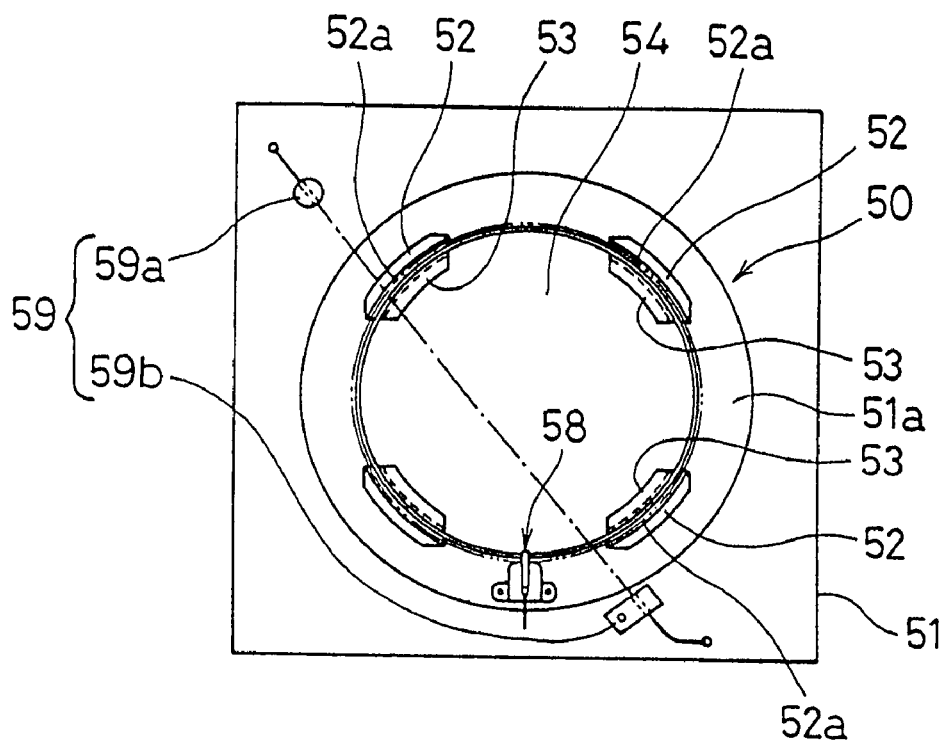
FIG. 8 is a plan view of the handling table.
Figure 9:
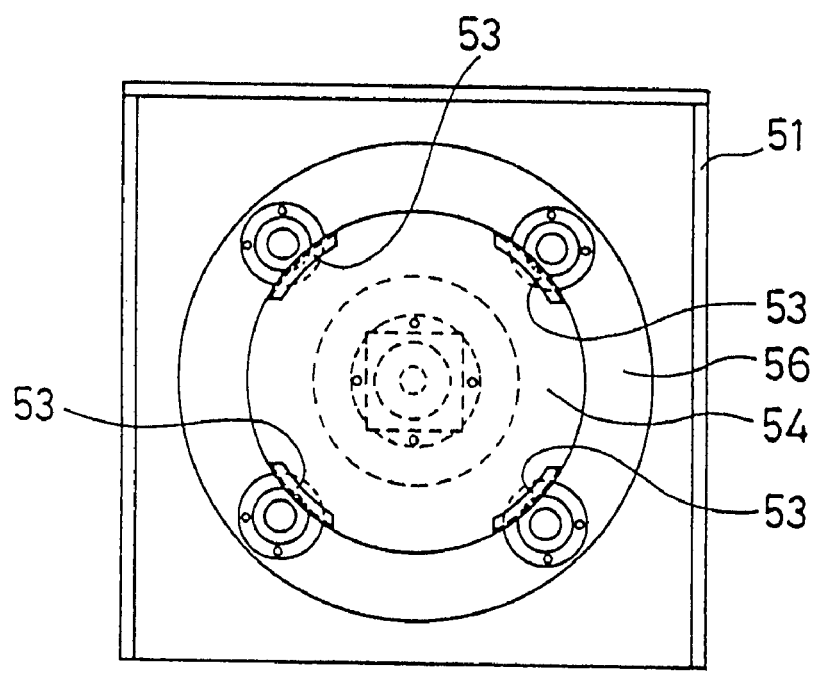
FIG. 9 is a view taken along line IX—IX of FIG. 7.

FIGS. 7 through 9 show details of the handling table 50. FIG. 7 is a front elevational view of the handling table, FIG. 8 is a plan view of the handling table, and FIG. 9 is a view taken along line IX—IX of FIG. 7.

As shown if FIGS. 7 through 9, the handling table 50 has a box-shaped frame 51, four support members 52 fixed to plate 51a on an upper surface of the frame 51 and having inverted conical tapered surfaces 52a for contacting the outer circumferential edge of a semiconductor wafer 6 to support the semiconductor wafer 6, and four positioning members 53 for receiving the semiconductor wafer 6 supported by the support members 52 and rotating the semiconductor wafer 6 in a predetermined angular range. The four positioning members 53 are fixed to a rotatable base 54 which can be rotated by a motor 55. The motor 55 and the rotatable base 54 are supported by a lifting and lowering base 56 which can be lifted and lowered by an air cylinder 57. The reference numeral 60 represents splined shafts.

A notch detecting sensor 58 for detecting a notch in the outer circumferential edge of a semiconductor wafer 6 is fixedly mounted on an upper surface of the plate 51a. A wafer detecting sensor 59 for detecting whether or not a semiconductor wafer 6 is present on the tapered surfaces 52a of the support members 52 is fixedly mounted on the upper surface of the frame 51.

Figure 10A:
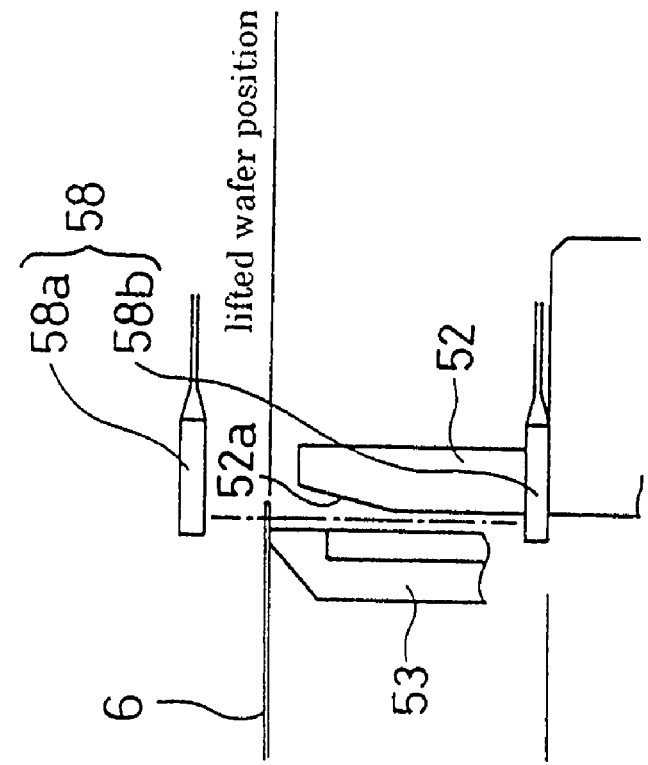
FIGS. 10A and 10B are views showing the relationship between a notch detecting sensor, a support member, and a positioning member.
Figure 10B:
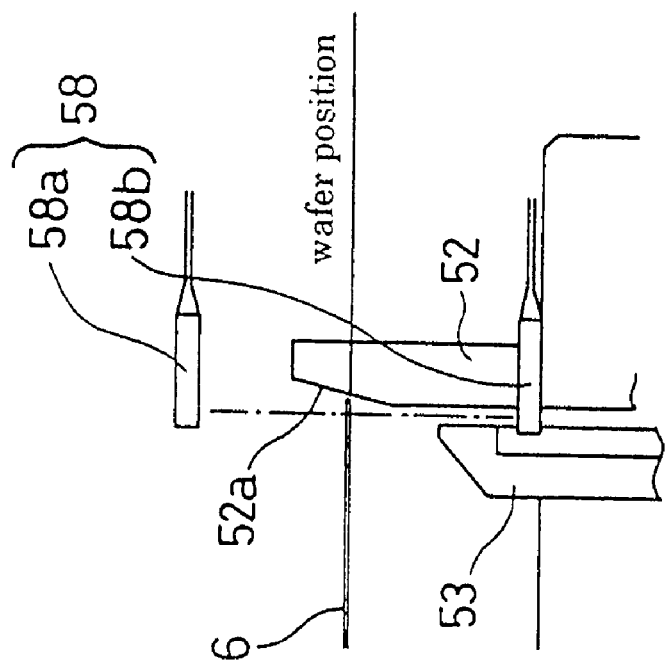

FIGS. 10A and 10B show the relationship between the notch detecting sensor 58, the support member 52, and the positioning member 53. As shown in FIGS. 10A and 10B, the notch detecting sensor 58 comprises a light-emitting element 58a and a light-detecting element 58b. A semiconductor wafer 6 supported along a predetermined circumferential line on the tapered surfaces 52a of the support members 52 is received by the positioning members 53 lifted by the air cylinder 57. Thereafter, the positioning member 53 is rotated by the motor 55. The notch detecting sensor 58 has its optical axis adjusted to a position capable of detecting a notch in the rotating semiconductor wafer 6. Light from the light-emitting element 58a is normally blocked. Only when the notch of the semiconductor wafer 6 passes across the optical axis, the light-detecting element 58b detects the light from the light-emitting element 58a, converts the detected light into an electric signal, and outputs the electric signal. The notch detecting sensor 58, the positioning member 53, the rotatable base 54, and the motor 55 jointly constitute a positioning mechanism for positioning the notch of the semiconductor wafer 6.

As shown in FIGS. 7 and 8, the wafer detecting sensor 59 comprises a light-emitting element 59a and a light-detecting element 59b. When light from the light-emitting element 59a is blocked by a semiconductor wafer 6 on the tapered surfaces 52a of the support members 52 and does not reach the light-detecting element 59b, it is determined that the semiconductor wafer 6 is present on the support members 52.

FIG. 11 shows a control circuit for the notch detecting sensor 58, the wafer detecting sensor 59 and the motor 55. As shown in FIG. 11, the notch detecting sensor 58 is connected to a drive unit 62 via a sensor amplifier 61. The drive unit 62 and the motor (direct-drive motor) 55 are connected to each other by a motor cable and a resolver cable. The drive unit 62 is connected to a board computer 64 by an RS232C cable. The wafer detecting sensor 59 is connected to the board computer 64 via a sensor amplifier 66. A home-position confirming sensor 67 for confirming the home position of the motor 55 is provided and connected to the board computer 64 via a sensor amplifier 68. A detectable member 75 for being detected by the home-position confirming sensor 67 is fixed to the rotatable base 54 (see FIG. 7).

Operation of the handling table 50 constructed as shown in FIGS. 7 through 11 will be described below.

A semiconductor wafer 6 processed by the processing section is transferred onto the tapered surfaces 52a of the support members 52 of the handling table 50 by the robot 11a. At this time, the semiconductor wafer 6 is centered by the four tapered surfaces 52a (see FIG. 10A). When the semiconductor wafer 6 is transferred onto the support members 52, the semiconductor wafer 6 is detected by the wafer detecting sensor 59. When the semiconductor wafer 6 is detected, the air cylinder 57 is actuated to lift the positioning members 53 to receive the semiconductor wafer 6, which is then made rotatable (see FIG. 10B). The board computer 64 then starts to energize the motor 55.

When the notch of the semiconductor wafer 6 moves across the notch detecting sensor 58, the notch detecting sensor 58 outputs a signal (ON), which is applied to the drive unit 62. The motor 55 rotates by a preset number of pulses from the time at which the signal (ON) is outputted from the notch detecting sensor 58, and then stops. The notch of the semiconductor wafer 6 is now positioned in alignment with a predetermined direction.

After the motor 55 is stopped, the air cylinder 57 is actuated to lower the positioning members 53. The semiconductor wafer 6 is transferred from the positioning members 53 to the support members 52. After the positioning members 53 are lowered, the motor 55 is rotated to return to its home position. When the motor 55 returns to its home position, the home position is detected by the home-position confirming sensor 67. Then, the SCARA robot 31 receives the semiconductor wafer 6 on the support members 52, and transfers the semiconductor wafer 6 into the wafer cassette 41 in one of the wafer cassette units 40.

For supplying a semiconductor wafer 6 from the wafer cassette 41 to the handling table 50 with the SCARA robot 31 and supplying the semiconductor wafer 6 from the handling table 50 to the processing section with the SCARA robot 11a, the notch of the semiconductor wafer 6 is normally not positioned on the handling table 50. However, the notch of the semiconductor wafer 6 may be positioned on the handling table 50. Each of the notch detecting sensor 58 and the wafer detecting sensor 59 is shown as comprising a transmissive photosensor, but may be a reflective photosensor.

A processing operation in the processing section will be described below.

The polishing apparatus shown in FIG. 1 performs a serial processing and a parallel processing.

(1) Serial Processing (Sequential Processing)

In the serial processing (two-stage polishing), three cleaning machines are operated.

The semiconductor wafer moves in the following manner: the wafer cassette 41→the handling table 50→the reversing machine 12→the first polishing unit 2a→the cleaning machine 14a→the second polishing unit 2b→the cleaning machine 14b→the reversing machine 13→the cleaning machine 15a→the handling table 50→the wafer cassette 41

For handling a dry semiconductor wafer, the robots 11a, 11b use the dry fingers, and for handling a wet semiconductor wafer, the robots 11a, 11b use the wet fingers. The pusher 81 receives the semiconductor wafer 6 from the robot 11b, and when the top ring 7 moves above the pusher 81, the pusher 81 is lifted and transfers the semiconductor wafer 6 to the top ring 7. The top ring 7 is swung to a position over the polishing cloth of the polishing unit, and the semiconductor wafer 6 is polished. The top ring 7 which holds the polished semiconductor wafer 6 is swung again to a position above the pusher 81. The pusher 81 is elevated, and the semiconductor wafer 6 is transferred to the pusher 81. The semiconductor wafer 6 is rinsed by a rinsing liquid supply device that is disposed at the pusher 81.

In the polishing apparatus, the semiconductor wafer 6 is cleaned in such a state that the semiconductor wafer 6 is separated from the top ring 7 in the pusher 81 and the cleaning machine 14a. Therefore, not only the polished surface of the semiconductor wafer 6 can be cleaned, but also the abrasive liquid used in a primary polishing process can fully be removed from the surfaces of the semiconductor wafer 6. After being polished in a secondary polishing process, the semiconductor wafer 6 is cleaned by the cleaning machine 14b and the cleaning machine 15a, spin-dried, and returned to the wafer cassette 41 via the handling table 50. In the serial processing, polishing conditions in the first polishing unit 2a and in the second polishing unit 2b are different from each other.

(2) Parallel Processing:

In the parallel processing, four cleaning machines are operated. The two wafer cassettes may be used, or one of the wafer cassettes may be used in common.

There are two paths' of movement of the semiconductor wafer. One path is as follows: the wafer cassette 41→the handling table 50→the reversing machine 12→the polishing unit 2a→the cleaning machine 14a→the reversing machine 13→the cleaning machine 15a→the handling table 50→the wafer cassette 41

Another path is as follows: the wafer cassette 41→the handling table 50→the reversing machine 12→the polishing unit 2b→the cleaning machine 14b→the reversing machine 13→the cleaning machine 15b→the handling table 50→the wafer cassette 41

As with the serial processing, the reversing machine 12 is used to handle a dry semiconductor wafer before it is polished, and the reversing machine 13 is used to handle a wet semiconductor wafer after it is polished. Either one of the sets of the cleaning machines on both sides of the feed line may be used. In the parallel processing, the polishing units 2a, 2b are operated under the same polishing conditions, the cleaning machines 14a, 14b are operated under the same cleaning conditions, and the cleaning machines 15a, 15b are operated under the same cleaning conditions. After the semiconductor wafer 6 is cleaned and spin-dried by the cleaning machines 15a, 15b, the semiconductor wafer 6 is returned to the wafer cassette 41 via the handling table 50.

In the embodiment, the closed wafer cassette units have been described. However, open wafer cassette units may be used.

According to the first aspect of the present invention, as described above, the independent clean chamber disposed between the processing section and the receiving section offers the following advantages:

1) The cleanliness of the processing section is not required to be enhanced unnecessarily, and ancillary facilities including filters, fans, etc. can be reduced in size.

2) Since the cleanliness of the processing section is not required to be enhanced unnecessarily, the amount of air consumed in the clean room in which the polishing apparatus is installed may be small, and the operating cost may be reduced.

3) Possible subsequent demands for an increased level of cleanliness in the receiving section such as the wafer cassette units can easily be met by the present invention.

4) Processed products are prevented from suffering secondary contamination as much as possible, and hence can achieve increased quality of the products.

According to a second aspect of the present invention, a semiconductor wafer can be positioned by aligning a reference position (such as an orientation flat or a notch) of the semiconductor wafer with a predetermined direction during the transportation process between the processing section and the receiving section of the polishing apparatus. It is not necessary to perform a separate process for positioning a semiconductor wafer, but a plurality of processed semiconductor wafers can be aligned with a predetermined direction in the receiving section. Any dedicated machine for positioning semiconductor wafers is dispensed with.

According to a preferred aspect of the present invention, three steps of polishing a semiconductor wafer, cleaning the semiconductor wafer, and positioning a reference position of the semiconductor wafer can be carried out during automatic operation of one polishing apparatus.

INDUSTRIAL APPLICABILITY

The present invention relates to a polishing apparatus for polishing a workpiece such as a semiconductor wafer to a flat mirror finish, and is preferably used in a chemical mechanical polishing (CMP) process which is one of the steps of a semiconductor device fabrication process.

The invention claimed is:

1. A polishing apparatus for polishing a semiconductor wafer, comprising:
   a processing section including a polishing section for polishing a semiconductor wafer and a cleaning section for cleaning a polished semiconductor wafer;
   a receiving section for receiving at least one of wafer cassettes which supplies a semiconductor wafer to be processed to said processing section and/or receives a processed semiconductor wafer;
   a clean chamber disposed between said processing section and said receiving section for preventing a contaminated atmosphere in said processing section from affecting said receiving section;
   a load and unload section between said processing section and said receiving section;
   a first filter unit for cleaning air in said load and unload section while adjusting pressure of said load and unload section so as to be higher than pressure of a clean room in which said polishing apparatus is installed; and
   a second filter unit for cleaning air in said cleaning section while adjusting pressure of said cleaning section so as to be lower than the pressure of the clean room and higher than pressure of said polishing section.

2. The polishing apparatus according to claim 1, wherein pressure in said clean chamber is higher than pressure in said processing section and lower than pressure in said receiving section.

3. The polishing apparatus according to claim 1, wherein cleanliness in said clean chamber is higher than cleanliness in said processing section.

4. The polishing apparatus according to claim 1, wherein said clean chamber includes a partition with a shutter which separates said clean chamber from said receiving section or said processing section.

5. The polishing apparatus according to claim 1, further comprising:

a transfer device, for transferring a semiconductor wafer between said clean chamber and said receiving section, in said load and unload section.

* * * * *